(12) United States Patent
Narita

(10) Patent No.: US 7,713,843 B2
(45) Date of Patent: May 11, 2010

(54) METHOD FOR FABRICATING OPTICAL SEMICONDUCTOR DEVICE

(75) Inventor: Masakazu Narita, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 0 days.

(21) Appl. No.: 12/289,474

(22) Filed: Oct. 28, 2008

(65) Prior Publication Data

US 2009/0130830 A1  May 21, 2009

(30) Foreign Application Priority Data

Oct. 29, 2007  (JP) .......................... P2007-280855

(51) Int. Cl.
*H01L 21/46* (2006.01)
*H01L 21/78* (2006.01)
*H01L 21/301* (2006.01)

(52) U.S. Cl. ...................... 438/461; 438/608; 438/706; 438/712; 257/E21.17; 257/E21.218; 257/E21.229; 257/E21.278; 257/E21.293; 257/E21.346; 257/E21.347

(58) Field of Classification Search ................... 438/32, 438/57, 461, 553, 637, 671, 606, 683, 685, 438/686, 681, 706, 712, 608
See application file for complete search history.

(56) References Cited

U.S. PATENT DOCUMENTS 5,024,953 A * 6/1991 Uematsu et al. ............... 438/32

5,489,798 A * 2/1996 Doguchi et al. ............. 257/458
6,316,281 B1 * 11/2001 Lee et al. ...................... 438/31

FOREIGN PATENT DOCUMENTS

JP    2001-251007    9/2001

* cited by examiner

*Primary Examiner*—David Nhu
(74) *Attorney, Agent, or Firm*—Smith, Gambrell & Russell, LLP

(57) ABSTRACT

In the method of fabricating an optical semiconductor device, a semiconductor layer is formed on an InP region, and includes semiconductor films. A first etching mask is formed on the semiconductor layer. The semiconductor layer is etched through the first etching mask to form a semiconductor mesa and a first marking mesa, each mesa includes an active layer and an InP cladding layer, the InP cladding layer being provided on the active layer. The active layer is made of semiconductor material different from InP. An InP burying region is grown through the first etching mask on a side of the semiconductor mesa and a side of the first marking mesa to bury the semiconductor mesa and the first marking mesa. A second etching mask is formed on the InP burying region after removing the first etching mask, and has an opening located above the first marking mesa. InP in the InP burying region and the first marking mesa is etched through the second etching mask to form a second marking mesa. The alignment mark includes the second marking mesa, and the active layer is exposed on the top of the second marking mesa.

20 Claims, 13 Drawing Sheets

(a)

(b)

(a)

(b)

(a)

(b)

(a)

(b)

(a)

(b)

(a)

(b)

(a)

(b)

METHOD FOR FABRICATING OPTICAL SEMICONDUCTOR DEVICE

BACKGROUND OF THE INVENTION

1. Field of the Invention

The present invention relates to a method of fabricating an optical semiconductor device.

2. Related Background Art

In order to fabricating an optical semiconductor device, an alignment mark for lithography is formed on a wafer. It is known that a protecting film is formed on the alignment mark in order to prevent the alignment mark from being deformed or damaged during processes, as disclosed in Japanese Unexamined Patent Application Publication No. 2001-251007.

SUMMARY OF THE INVENTION

One type of optical semiconductor devices has a buried heterostructure (hereinafter referred to as "BH structure"). In order to fabricate such an optical semiconductor device, a semiconductor mesa is formed by etching, and has a heterostructure. Then, a burying region is regrown on both sides of the semiconductor mesa to burying both side surfaces of the mesa.

As described above, in order to form a BH structure in an optical semiconductor device, the following steps are needed: to form a semiconductor mesa by etching; and to re-grow a burying semiconductor region. Therefore, the formation of an etching mask and the removal of the etching mask after the regrowth are needed to form the semiconductor mesa. In order to protect an alignment mark in the above fabricating method, the following complicated steps are used: to form a protecting film on the alignment mark; to form the semiconductor mesa through an etching mask, the protecting film being left on the alignment mark; and to remove the etching mask. In this method, the formation of the protecting film has to be added to the steps of forming the optical semiconductor device, which increases the number of the steps.

It is an object of the present invention to provide a method of fabricating an optical semiconductor device, and this method can protect an alignment mark in the fabrication steps and avoid increasing the number of steps in order to protect an alignment mark.

One aspect of the present invention provides a method of fabricating an optical semiconductor device. This method comprises as follows. A semiconductor layer is formed on an InP region, and the semiconductor layer includes a plurality of semiconductor films. A first etching mask is formed on the semiconductor layer, and the first etching mask has a pattern for a semiconductor mesa and an alignment mark. The semiconductor layer is etched through the first etching mask to form a semiconductor mesa and a first marking mesa, each of the semiconductor mesa and the first marking mesa includes an active layer and an InP cladding layer, the InP cladding layer being provided on the active layer. The active layer is made of semiconductor material different from InP. An InP burying region is grown through the first etching mask on a side of the semiconductor mesa and a side of the first marking mesa to bury the semiconductor mesa and the first marking mesa. A second etching mask is formed on the InP burying region after removing the first etching mask. The second etching mask has an opening located above the first marking mesa. InP in the InP burying region and the first marking mesa is etched through the second etching mask to form a second marking mesa. The alignment mark includes the second marking mesa, and the active layer is exposed on the top of the second marking mesa.

In the aspect of the present invention, it is preferable that InP in the InP burying region and the first marking mesa be etched by use of an etchant and that the etchant have a smaller etching rate for the active layer than for InP. It is preferable that InP in the InP burying region and the first marking mesa be etched by use of an etchant and that the etchant include hydrochloric acid. It is preferable that the InP burying region have a part formed on the side of the first marking mesa, the part of the InP burying region be adjacent to the side of the first marking mesa, and that the opening of the second etching mask be located on the part of the InP burying region. It is preferable that the InP burying region have a part formed on the side of the semiconductor mesa, the part of the InP burying region be adjacent to the side of the semiconductor mesa, and that the second etching mask be located on the semiconductor mesa and the part of the InP burying region.

Another aspect of the present invention provides a method of fabricating an optical semiconductor device. This method comprises as follows. An active layer is grown on an InP region, and the active layer is made of semiconductor material different from InP. A first mask is formed on the active layer, and the first mask has a pattern for an alignment mark. The active layer is etched through the first mask to form an alignment mark. An InP cladding layer is grown on the active layer and a side and a top of the alignment mark, and the alignment mark is buried by the InP cladding layer. A second etching mask is formed on the InP cladding layer. The second mask has a first pattern for a semiconductor mesa, and has a second pattern above the alignment mark and a first part of the InP cladding layer, the first part of the InP cladding layer covering the side and top of the alignment mark. The active layer and the InP cladding layer are etched through the second etching mask to form the semiconductor mesa. InP is grown on a side of the semiconductor mesa to bury the semiconductor mesa. A third etching mask is formed on the semiconductor mesa and the InP cladding layer, and the third etching mask has an opening located on the alignment mark. InP in the InP cladding layer is etched through the third etching mask to expose the alignment mark, and the active layer is exposed on the top of the alignment mark.

In the other aspect of the present invention, it is preferable that InP in the InP cladding layer is etched by use of an etchant and that the etchant have a smaller etching rate for the active layer than for InP. It is preferable that InP in the InP burying region and the first marking mesa is etched by use of an etchant, and the etchant includes hydrochloric acid. It is preferable that the method according to the present invention further comprise the step of, after forming the first mask, before growing the InP cladding layer, forming a diffraction grating on the active layer. It is preferable that the InP cladding layer have a second part formed on the side of the semiconductor mesa, the second part of the InP cladding layer be adjacent to the side of the semiconductor mesa, and the third etching mask be located on the semiconductor mesa and the second part of the InP cladding layer.

In the above aspects, it is preferable that the active layer comprise an optical confinement layer. It is preferable that the optical confinement layer comprise one of GaInAsP and AlGaInAs. It is preferable that the active layer comprise a quantum well structure. It is preferable that the InP region comprise an InP substrate. It is preferable that the active layer comprise one of GaInAsP and AlGaInAs.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

DESCRIPTION OF THE PREFERRED EMBODIMENTS

The teachings of the present invention will readily be understood in view of the following detailed description with reference to the accompanying drawings illustrated by way of example. When possible, parts identical to each other will be referred to with reference symbols identical to each other.

First Embodiment

Figure 1:
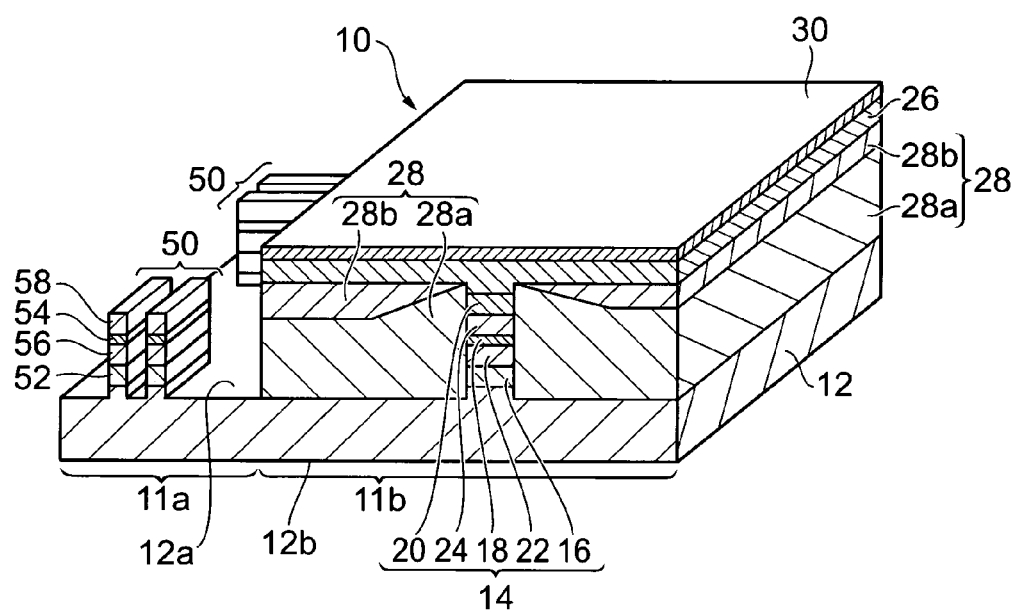
FIG. 1 is a perspective view showing the structure of a semiconductor laser and an alignment mark fabricated through a method of fabricating an optical semiconductor device in accordance with a first embodiment.

FIG. 1 is a perspective view showing the structure of an optical semiconductor device and an alignment mark provided through a method of fabricating an optical semiconductor device in accordance with the present embodiment. The perspective view is shown partly in section. In addition, this embodiment exemplifies a method of fabricating an optical semiconductor device, such as a semiconductor laser, having a BH structure, but the present invention is not limited to the method in accordance with this embodiment for a semiconductor laser and may be applied to any other optical semiconductor devices having a BH structure, such as an optical semiconductor modulator. Referring to FIG. 1, the optical semiconductor device and the alignment mark can be formed on a wafer.

As shown in FIG. 1, a semiconductor laser 10 is fabricated through the method in accordance with this embodiment, and includes an InP substrate 12 of a first conductivity type, such as n-type, and a semiconductor mesa 14 provided on a primary surface 12a of the InP substrate 12.

The semiconductor mesa 14 includes a buffer layer 16, an active layer 18, and an InP cladding layer 20. The semiconductor mesa 14 further includes an optical confinement layer 22 and an optical confinement layer 24. The buffer layer 16 is provided on the primary surface 12a of the InP substrate 12, the active layer 18 is provided on the buffer layer 16, and the InP cladding layer 20 is provided on the active layer 18. The semiconductor mesa 14 further includes an optical confinement layer 22 and an optical confinement layer 24. The optical confinement layer 22 is provided between the buffer layer 16 and the active layer 18, and the optical confinement layer 24 is provided between the active layer 18 and the InP cladding layer 20.

The buffer layer 16 can be made of, for example, n-type InP. The thickness of the buffer layer 16 is, for example, 550 nm, and the buffer layer 16 and the InP substrate 12 functions as a lower cladding region for the active layer 18. The active layer 18 includes an InP compound semiconductor, the band gap of which is a smaller than band gaps of the buffer layer 16 and the InP cladding layer 20, and the thickness of the active layer 18 is, for example, 200 nm. The active layer 18 may include a single semiconductor layer, but preferably includes a single quantum well (SQW) or multi quantum well (MQW) structure. In one example, a luminescence wavelength of the active layer 18 is, for example, 1.3 μm to 1.5 μm, and the quantum well structure of the active layer 18 is formed by alternately depositing two kinds of semiconductor layers (for example, well and barrier layers), such as GaInAsP or AlGaInAs, the compositions of which that are different from each other in their elemental ratio. The InP cladding layer 20 is also composed of p-type (second conductivity type) InP. The thickness of the InP cladding layer 20 is, for example, 450 nm. The InP cladding layer 20 and an InP cladding layer 26 functions as an upper cladding region for the active layer 18.

The optical confinement layer 22 is composed of an InP compound semiconductor, the band gap of which is smaller than that of the buffer layer 16 and is larger than that of the active layer 18. The optical confinement layer 24 is also composed of an InP compound semiconductor, the band gap of which is smaller than that of the InP cladding layer 20 and is larger than that of the active layer 18. In one example, the optical confinement layers 22 and 24 are composed of GaInAsP or AlGaInAs. The optical confinement layers 22 and 24 have a thickness of, for example, 50 nm.

An InP burying region 28 is provided on both sides of the semiconductor mesa 14. The InP burying region 28 is an isolation region disposed on the primary surface 12a of the InP substrate 12 and regrown to cover both side surfaces of the semiconductor mesa 14, and is in contact with the side of each layer in the semiconductor mesa 14. FIG. 1 shows the InP burying region 28, which covers both side surfaces of the semiconductor mesa 14 and includes a p-type InP layer 28a and an n-type InP layer 28b. The p-type InP layer 28a is provided on the primary surface 12a of the InP substrate 12, and the n-type InP layer 28b is provided on the p-type InP layer 28a. When current is supplied to the semiconductor laser 10, this structure enables the InP burying region 28 to effectively confine current to the semiconductor mesa 14. The InP layers 28a and 28b have a thickness of, for example, 1200 nm. The InP burying region may be made of other structures, for example, a semi-insulating InP layer doped with an element such as iron (Fe), and the side of the semiconductor mesa 14 is covered with the Fe-doped layer.

The InP cladding layer 26 and a contact layer 30 are provided in this order over the semiconductor mesa 14 and the InP burying region 28. The InP cladding layer 26 is made of p-type InP, and has a thickness of, for example, 1600 nm. The contact layer 30 is made of a p-type group III-V compound semiconductor, for example, p-type GaInAs. The thickness of the contact layer 30 is, for example, equal to or less than 500 nm.

An insulating film 14 is provided on the contact layer 30, and has an opening above the semiconductor mesa. In addition, one electrode is electrically connected to the contact layer 30 through the opening of the insulating film, and has, for example, a Ti/Pt/Au structure. Another electrode is provided on a bottom surface 12b of the InP substrate 12, and has, for example, an AuGeNi/Au structure. Current is supplied to the active layer 18 in response to the application of voltage across the electrodes to emit light from the end face of the semiconductor laser 10.

In the method in accordance with the present embodiment, alignment marks 50 for lithography are formed in the first region 11a in the InP substrate 12, and, as shown in FIG. 1, the InP substrate 12 has the second region 11b, which is different from the first region 11a, for the semiconductor laser 10. Each of the alignment marks 50 includes an InP buffer layer 52 formed on the primary surface 12a of the InP substrate 12 and an active layer 54 provided on the InP buffer layer 52. The alignment mark 50 further includes an optical confinement layer 56 and an optical confinement layer 58. The optical confinement layer 56 is provided between the InP buffer layer 52 and the active layer 54, and the optical confinement layer 58 is provided on the active layer 54. The InP buffer layer 52, the active layer 54, and the optical confinement layers 56 and 58 have the same composition and thickness as the buffer layer 16, the active layer 18, and the optical confinement layers 22 and 24, respectively. The InP buffer layer 52, the active layer 54, and the optical confinement layers 56 and 58 are formed in the same steps as the buffer layer 16, the active layer 18, and the optical confinement layers 22 and 24, respectively.

As shown in FIG. 1, the alignment mark 50 includes a first group of raised portions. These raised portions extend parallel to each other and are aligned in one direction. The alignment mark 50 further includes a second group of raised portions. These raised portions extend parallel to each other and are aligned in another direction, which may be orthogonal to the one direction. The raised portions are distant, for example, 10 μm from each other. Each raised portion has a width of, for example, 10 μm.

Figure 2:
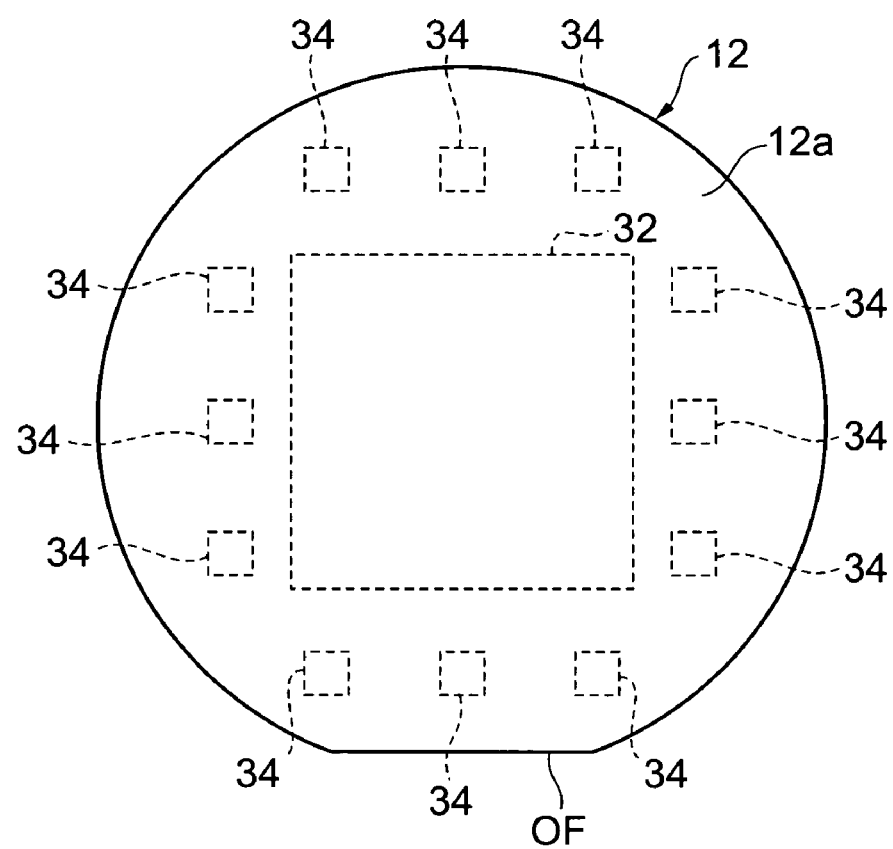
FIG. 2 is a top view showing an InP substrate as a wafer on which the semiconductor laser and the alignment marks are formed shown in FIG. 1.

FIG. 2 is a top view showing the planar shape of the InP substrate 12 used as a wafer, on which the semiconductor laser 10 and the alignment marks 50 shown in FIG. 1 are formed. An orientation flat OF is located on the edge of the InP substrate 12. The first region 11a is provided in the middle of the primary surface 12a of the InP substrate 12. The first region 11a includes plural regions arranged in a matrix in a pattern region 32, and the optical semiconductor devices are formed in each of the plural regions of the pattern region 32. Further, the second regions 11b are provided in the periphery of the primary surface 12a of the InP substrate 12, and the second regions 11b includes alignment mark regions 34, in each of which the alignment marks 50 are formed. The arrangement of the alignment mark regions 34 surround the pattern region 32.

Next, the method of fabricating the optical semiconductor device, such as semiconductor laser 10, in accordance with this embodiment will be described in detail. FIGS. 3 to 6 are perspective views showing the steps of the method in accordance with the present embodiment. The method is preferably performed, for example, in the following order.

(Deposition Step)

First, an n-type semiconductor substrate, such as an InP substrate 12, is prepared, and the n-type InP substrate 12 has the primary surface of (100) face. On the n-type InP substrate 12, a semiconductor layer 72 is grown, and semiconductor layer 72 includes plural layers for a semiconductor mesa 14 shown in FIG. 1. Specifically, as shown in Part (a) of FIG. 3, the following layer are grown in series on the primary surface 12a of the InP substrate 12: an n-type InP semiconductor film 60 for forming buffer layers 16 and 52; a GaInAsP semiconductor film (or AlGaInAs semiconductor film) 62 for forming optical confinement layers 22 and 56; a GaInAsP/GaInAsP superlattice multilayer film (or AlGaInAs/AlGaInAs superlattice multilayer film) 64 for forming active layers 18 and 54; a GaInAsP semiconductor film (or AlGaInAs semiconductor film) 66 for forming optical confinement layers 24 and 58; a p-type InP semiconductor film 68 for forming an InP cladding layer 20; and a p-type GaInAs semiconductor film 70 for forming a capping layer. In a preferred embodiment, these semiconductor films 60, 62, 64, 66, 68, and 70 may be epitaxially grown on the wafer through metal-organic chemical vapor deposition (MOCVD). The n-type InP semiconductor film 60 may be doped with, for example, silicon (Si) as an n-type dopant. The p-type InP semiconductor film 68 and the p-type GaInAs semiconductor film 70 may be doped with, for example, zinc (Zn) as a p-type dopant.

(First Etching Step)

Figure 3:
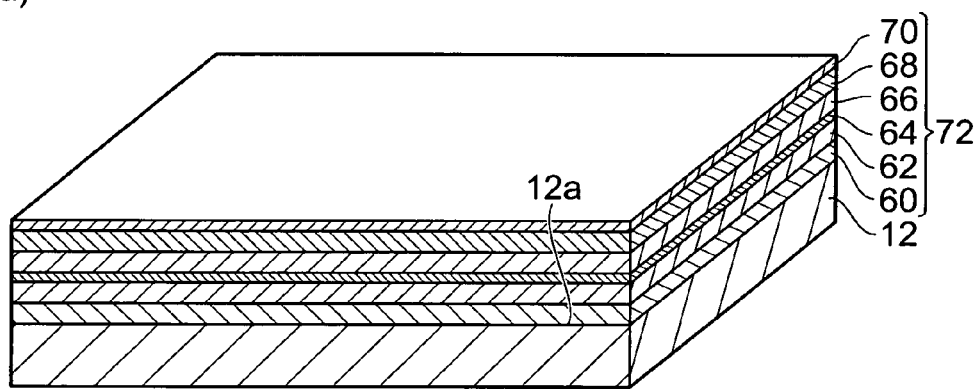
FIG. 3 shows a deposition step and a first etching step in the first embodiment.
Figure 3:
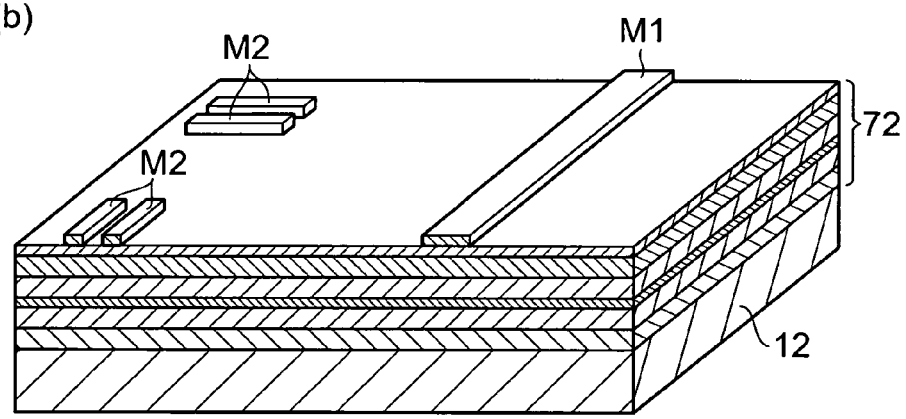

With reference to Part (b) of FIG. 3, etching masks M1 and M2 are formed on the semiconductor layer 72. The etching mask M1 has the first pattern that defines the planar shape of the semiconductor mesa 14, and extends in the direction of an optical waveguide. The etching mask M2 has the second pattern that defines the planar shape of the alignment mark 50. Specifically, an insulating film (for example, SiN, SiON, or $SiO_2$) is first deposited on the semiconductor layer 72, and the insulating film has a thickness of, for example, 100 nm. Next, photoresist is applied onto the insulating film, and then is exposed to light to pattern the photoresist. The photoresist is developed to form a patterned photoresist, and the patterned photoresist includes the pattern that defines the planar shapes of the semiconductor mesa 14 and the alignment marks 50. After developing the photoresist, the insulating film is etched through the patterned photoresist by dry etching, such as reactive ion etching (RIE), or by wet etching using etchant, such as hydrofluoric acid (HFaq) or buffered hydrofluoric acid (BHF). After the above steps, the etching masks M1 and M2 are formed and have first and second patterns for the planar shapes of the semiconductor mesa 14 and the alignment marks 50, respectively. After forming the etching masks M1 and M2, the patterned photoresist is removed by ashing or liquid solution treatment.

Next, a part of the semiconductor layer 72 is removed through the etching masks M1 and M2 by etching, and the part of the semiconductor laminate 72 is not covered with the etching masks M1 and M2. A preferred technique for this etching is, for example, dry etching, such as RIE, or wet etching using etchant, such as a mixed solution of Br and methanol. After the etching, the n-type InP substrate 12 is exposed, and the depth in the etching is, for example, about 2.0 μm. Both semiconductor mesa 14 and mark mesa 78 are formed at the same time. The semiconductor mesa 14 includes the buffer layer 16, the optical confinement layer 22, the active layers 18, the optical confinement layer 24, the InP cladding layer 20, and a capping layer 36, as shown in Part (a) of FIG. 4. The mark mesa 78 is formed which includes the buffer layer 52, the optical confinement layer 56, the active layer 54, the optical confinement layer 58, the InP cladding layer 74, and a capping layer 76.

(Regrowth Step)

Figure 4:
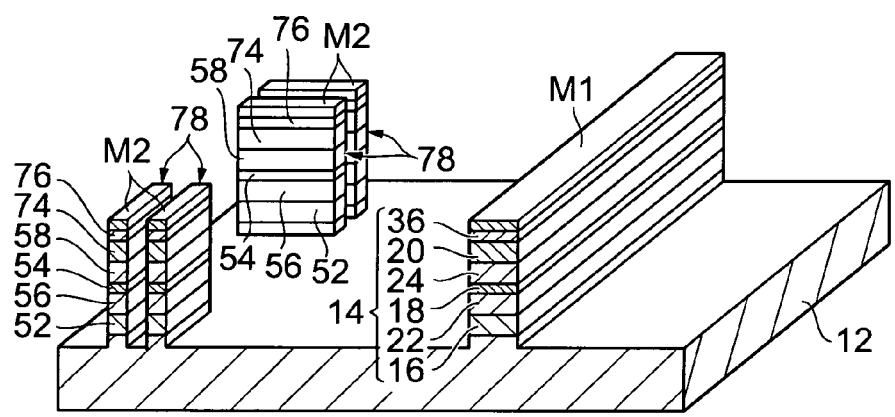
FIG. 4 shows the first etching step and a burying layer regrowth step in the first embodiment.
Figure 4:
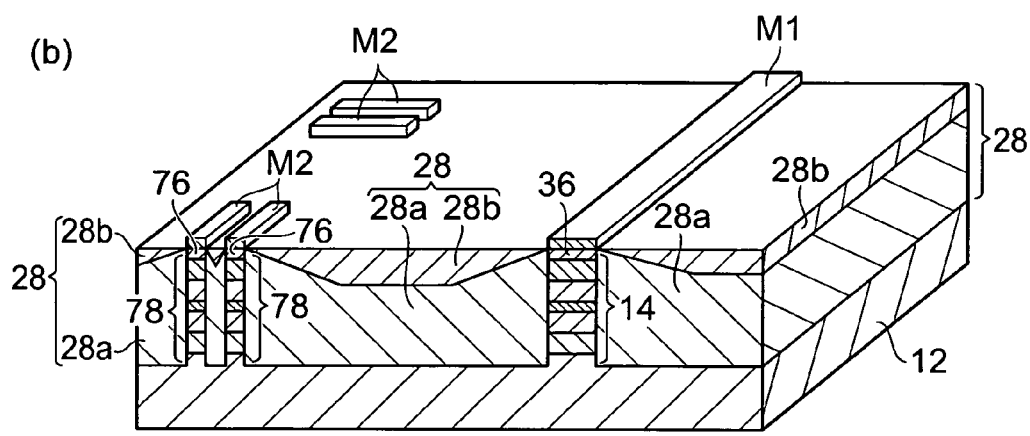

Next, an InP burying region 28 is grown on the InP substrate 12, thereby burying both side surfaces of the semiconductor mesa 14 and the marking mesa 78, as shown in Part (b) of FIG. 4. After this regrowth step, the etching masks M1 and M2 are not buried and are exposed at the top surface. In a preferred embodiment, a p-type InP layer 28a and an n-type InP layer 28b may be epitaxially grown in series by MOCVD to form the InP burying region 28. Alternatively, Fe-doped InP may be epitaxially grown by MOCVD to form the InP burying region 28.

After the regrowth step, the etching masks M1 and M2 are removed. Since the etching masks M1 and M2 are made of insulating films, these masks can be removed by, for example, wet etching using etchant, such as hydrofluoric acid (HFaq) or buffered hydrofluoric acid (BHF). Then, the capping layers 36 and 76 are removed. The capping layers 36 and 76 are removed by, for example, phosphoric acid ($H_3PO_4$). This can moderate the effect on crystal growth in a step of forming a cladding contact described below.

(Cladding-Contact Forming Step)

Figure 5:
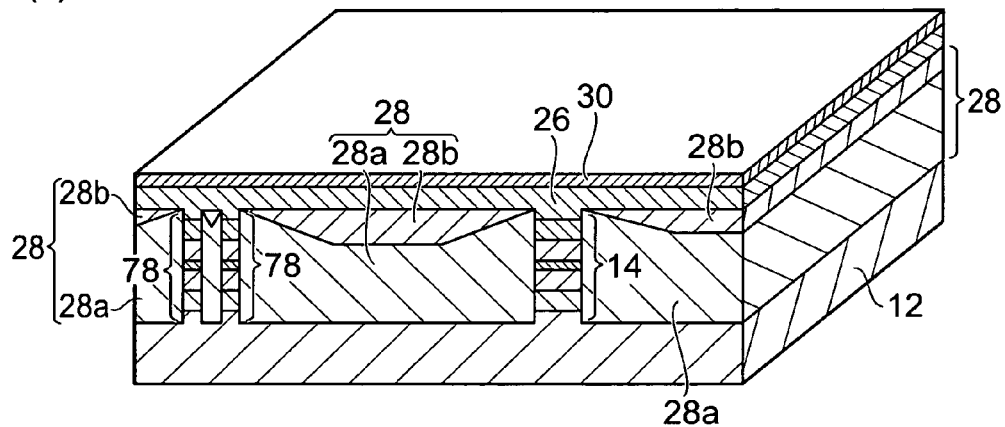
FIG. 5 shows a cladding-contact forming step and a second etching step in the first embodiment.
Figure 5:
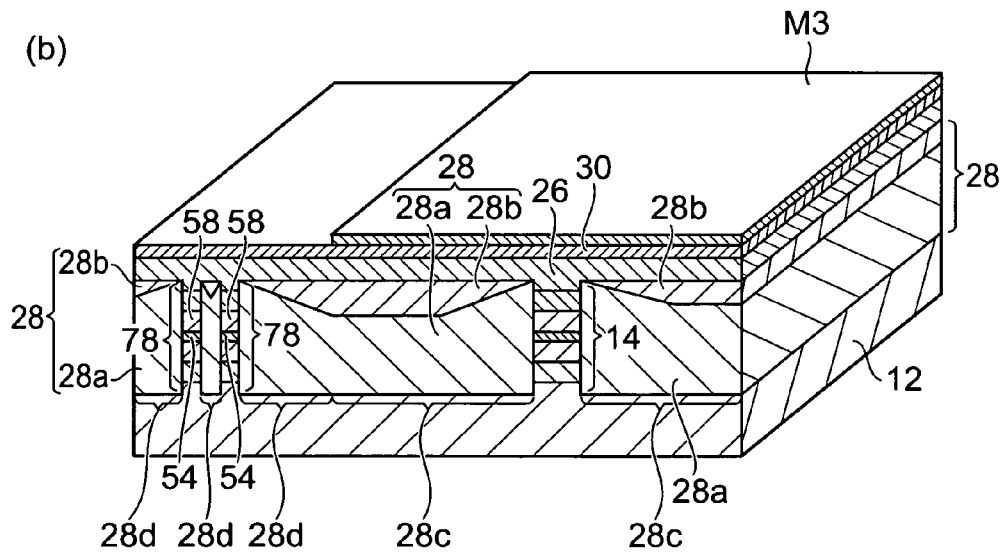

With reference to Part (a) of FIG. 5, a p-type InP semiconductor film is grown over the semiconductor mesa 14 and the burying region 28 to form an InP cladding layer 26. Then, a p-type GaInAs semiconductor film is grown on the InP cladding layer 26 to form the contact layer 30. In a preferred embodiment, MOCVD can be used for the epitaxial growth of the p-type InP semiconductor film for the InP cladding layer 26 and the p-type GaInAs semiconductor film for the contact layer 30. This step also forms both InP cladding layer 26 and contact layer 30 on the marking mesa 78.

(Second Etching Step)

With reference to Part (b) of FIG. 5, an etching mask M3 is formed. This etching mask M3 covers the semiconductor mesa 14 and the first region 27c of the InP burying region 28. The first region 28c is located on both side surfaces of the semiconductor mesa 14. The InP burying region 28 includes the second region 28d that buries both side surfaces of the marking mesa 78 and that is different from the first region 28c. Specifically, the etching mask M3 is formed as follows. An insulating film, such as SiN, SiON, or $SiO_2$, is first deposited on the contact layer 30, and the insulating film has a thickness of, for example, 100 nm. Next, photoresist is applied onto the insulating film, and then is exposed to light to transfer a pattern. This pattern defines the semiconductor mesa 14 and the first region 28c of the InP burying region 28. Since an alignment in this step does not need a high accuracy, the center and orientation flat OF of the wafer may be mechanically detected to carry out this alignment of the exposed region.

After developing the exposed photoresist to form the patterned photoresist, the insulating film is etched through the patterned photoresist by dry etching, such as reactive ion etching (RIE), or by wet etching using hydrofluoric acid (HFaq) or buffered hydrofluoric acid (BHF). This etching forms the etching mask M3. The patterned photoresist is removed by ashing or liquid solution treatment.

Next, the marking mesa 78 and the second region 28d of the InP burying region 28 are etched using the etching mask M3 on the semiconductor layers deposited on the InP substrate 12, and the marking mesa 78 and the second region 28d are not covered with the etching mask M3. In this etching step, the upper portion of the marking mesa 78 is removed, and the lower region of the marking mesa 78 is left. This lower region includes a semiconductor layers from the active layer 54 to the buffer layer 52 in the marking mesa 78. In order to perform this etching, an etchant having a smaller etching rate to the active layer 54 than for InP is used. In a preferred embodiment in which the active layer 54 is made of GaInAsP or AlGaInAs, a solution containing hydrochloric acid may be used as the above etchant to perform selective etching. Meanwhile, in this embodiment in which the optical confinement layer 58 of the marking mesa 78 includes the same constituent elements as the active layer 54, the optical confinement layer 58 is left on the active layer 54, and after the selective etching, the lower portion includes semiconductor layers from the optical confinement layer 58 to the buffer layer 52.

Figure 6:
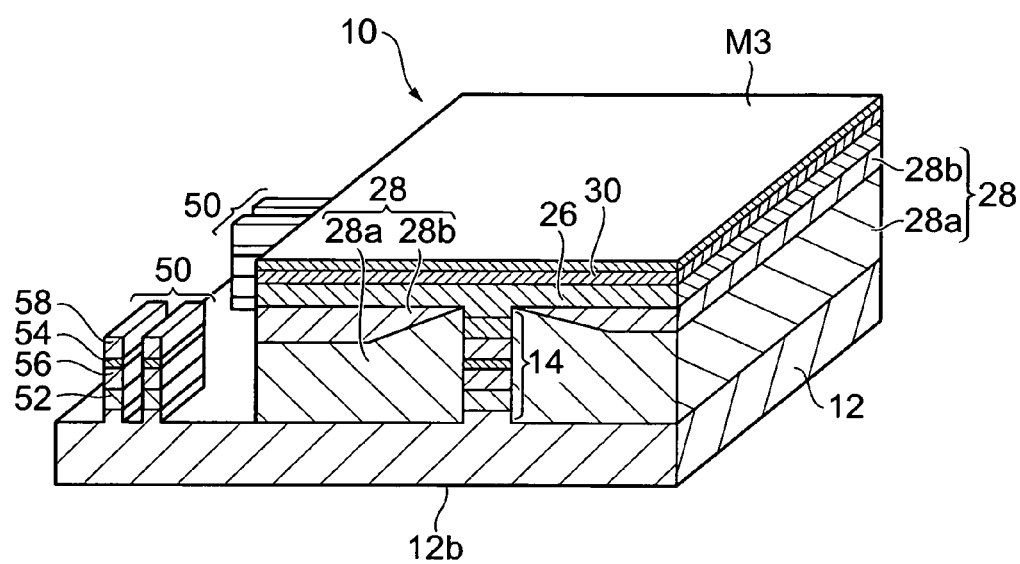
FIG. 6 shows the second etching step in the first embodiment.

As a result, the alignment marks 50 are formed. The alignment marks 50 includes the buffer layer 52, the optical confinement layer 56, the active layer 54, and the optical confinement layers 58, and protrudes to a sufficiently recognizable extent from the InP substrate 12, as shown in FIG. 6. Then, the etching mask M3 is removed by, for example, wet etching using hydrofluoric acid (HFaq) or buffered hydrofluoric acid (BHF). The above-described steps provide a semiconductor laser 10 and the alignment marks 50 shown in FIG. 1.

(Insulating Layer and Electrode Forming Step)

Then, an insulating layer is formed on the contact layer 30, and the insulating layer has an opening. An electrode is formed on the insulating layer, and is connected through the opening to the contact layer 30. Further, another electrode is formed on a back surface 12b of the InP substrate 12. In these steps, the alignment marks 50 that have formed in the previous step are used as a fiducial for alignment. Finally, the InP substrate 12 is divided into semiconductor laser chips to obtain BH structure semiconductor lasers 10.

Advantages will be described which are provided by the method of fabricating an optical semiconductor device in accordance with this embodiment. In the method in accordance with this embodiment, the marking mesa 78 for forming each of the alignment marks 50 is formed together with the semiconductor mesa 14, and then the marking mesa 78 and the semiconductor mesa 14 are buried by the InP burying region 28. Then, in the second etching step after the burying step, a difference in the etching rates between one layer in the marking mesa 78, such as the InP burying region 28 and InP cladding layer 74, and another layer in the marking mesa 78, such as the active layer 54, is utilized to leave a part of the marking mesa 78, and this part of the marking mesa 78 includes all the intervening layers from the active layer 54 to the buffer layer 52 in the marking mesa 78 (from the optical confinement layer 58 to the buffer layer 52 in this embodiment). These layers can properly form the alignment marks 50. As explained above, the method in accordance with the present embodiment provides the following: the steps for forming the semiconductor laser 10 can be utilized to protect the alignment marks 50; and an additional step of forming a film to protect the alignment mark 50 is not needed. Therefore, the alignment marks 50 can be surely protected without an additional step as compared to conventional processes.

In addition, it is more preferred that the active layer 54 is composed of GaInAsP or AlGaInAs and that a solution containing hydrochloric acid is used as the etchant in the second etching step, as shown in this embodiment. Since the solution containing hydrochloric acid ensures an etching rate for InP much higher than that for GaInAsP or AlGaInAs, InP (the InP burying region 28 or the InP cladding layer 74) covering the active layer 54 can be selectively etched in the second etching step.

Second Embodiment

Figure 7:
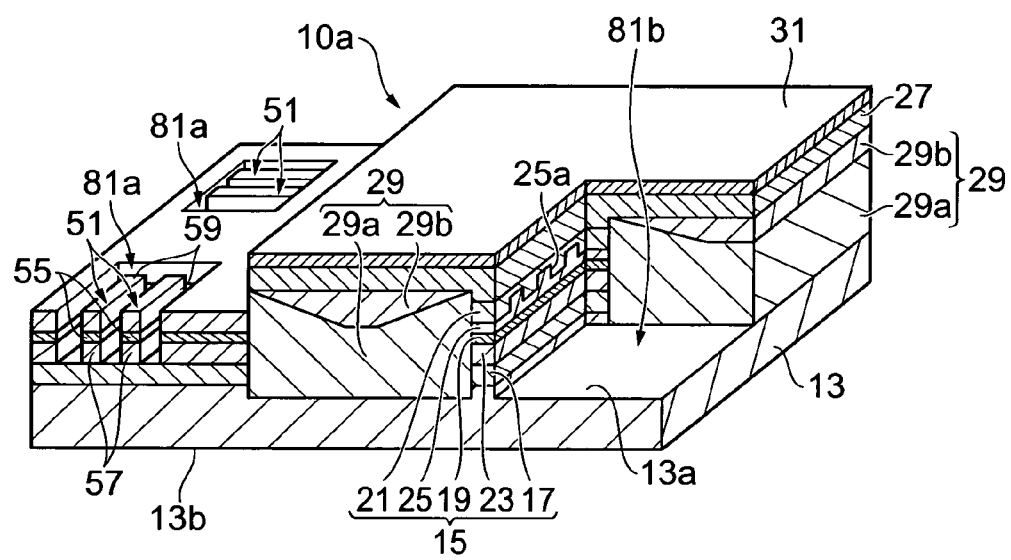
FIG. 7 is a perspective view showing the structure of a semiconductor laser and an alignment mark fabricated through a method of fabricating an optical semiconductor device in accordance with a second embodiment.

FIG. 7 is a perspective view showing the structure of an optical semiconductor device and an alignment mark fabricated through a method of fabricating an optical semiconductor device in accordance with the present embodiment. Referring to FIG. 7, the optical semiconductor device and the alignment mark are formed on a wafer. The perspective view is shown partly in section, and FIG. 7 also shows the internal structure of the optical semiconductor device. This embodiment exemplifies a method of fabricating an optical semiconductor device, such as, a distributed feedback (DFB) semiconductor laser of a BH structure. This method in accordance with the present embodiment is not limited to the specific optical semiconductor device, and can be applied to other optical semiconductor devices.

A semiconductor laser 10a is fabricated through the method in accordance with this embodiment, and includes an n-type (first conductivity type) InP substrate 13 and a semiconductor mesa 15 on a primary surface 13a of the InP substrate 13, as shown in FIG. 7.

The semiconductor mesa 15 includes a buffer layer 17, an active layer 19 and an InP cladding layer 21. The buffer layer 17 is provided on the primary surface 13a of the InP substrate 13, the active layer 19 is provided on the buffer layer 17, and the InP cladding layer 21 is provided on the active layer 19. The semiconductor mesa 15 further includes an optical confinement layer 23 and an optical confinement layer 25. The optical confinement layer 23 is provided between the buffer layer 17 and the active layer 19, and the optical confinement layer 25 is provided between the active layer 19 and the InP cladding layer 21. Then, a diffraction grating 25a is formed in a boundary region between the optical confinement layer 25 and the InP cladding layer 21. Other features, such as materials, film thickness and internal structure, of the buffer layer 17, the active layer 19, the InP cladding layer 21 and the optical confinement layers 23 and 25 of the semiconductor mesa 15 are similar to those of the buffer layer 16, the active layer 18, the InP cladding layer 20 and the optical confinement layers 22 and 24 included in the semiconductor mesa 14 of the first embodiment described above.

An InP burying region 29 is provided on both sides of the semiconductor mesa 15, and works as an isolation region on the primary surface 13a of the InP substrate 13. The InP burying region 29 is grown on both side surfaces of the semiconductor mesa 15, and has a similar composition to that of the burying region 28 in the first embodiment. Accordingly, the InP burying region 29 covers both side surfaces of the semiconductor mesa 15, and includes a p-type InP layer 29a provided on the primary surface 13a of the InP substrate 13 and an n-type InP layer 29b provided on the InP layer 29a. Alternatively, the InP burying region may include a semi-insulating InP layer doped with an element such as iron (Fe).

An InP cladding layer 27 and a contact layer 31 are formed in this order over the semiconductor mesa 15 and the InP burying region 29. The InP cladding layer 27 and the contact layer 31 have similar features (materials and layer thickness) to those of the InP cladding layer 26 and the contact layer 30 in the first embodiment.

An insulating film is provided on the contact layer 31 in this embodiment, and the insulating film has an opening located above the semiconductor mesa 15. Then, an electrode is electrically connected to the contact layer 31 through the opening of the insulating film. Another electrode is also provided on a back side 13b of the InP substrate 13. A voltage is applied across these electrodes to supply current to the active layer 19. In response to the injection of the current, the active layer 19 emit light, and this light is provided from the end face of the semiconductor laser 10b.

Referring to FIG. 7, alignment marks 51 for lithography is fabricated through the method in accordance with this embodiment, and are located in a mark region 81a which is different from a device region 81b defined for the semiconductor laser 10b on the InP substrate 13. Each of the alignment marks 51 includes an optical confinement layer 57 formed on the primary surface 13a of the InP substrate 13, an active layer 55 provided on the optical confinement layer 57, and an optical confinement layer 59 provided on the active layer 55. The active layer 55 may have the same composition and thickness as the active layer 19, and the optical confinement layers 57 and 59 have the same composition and thickness as the optical confinement layers 23 and 25, respectively. The alignment marks 51 each also have a planar shape similar to that of the alignment mark 50 in the first embodiment. The semiconductor laser 10b and the alignment marks 51 are located on the InP substrate 13 as in the first embodiment as shown in FIG. 2.

Next, the method of fabricating semiconductor laser 10b in accordance with this embodiment will be described in detail. FIGS. 8 to 13 are perspective views showing the steps of the present method in accordance with this embodiment. These steps are preferably performed, for example, in the following order.

(Deposition Step)

Figure 8:
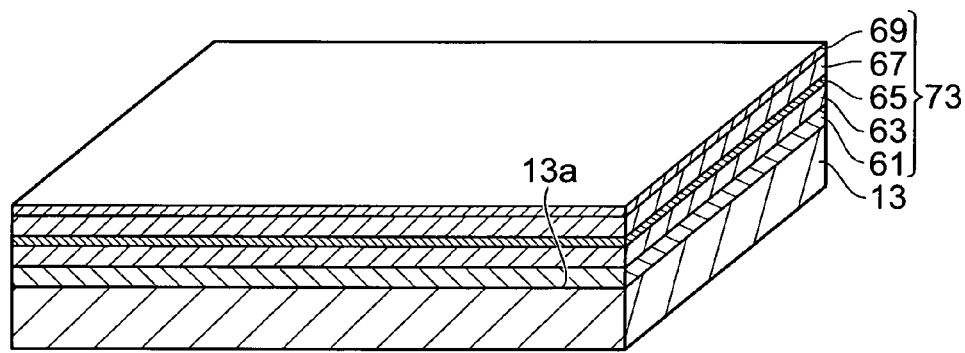
FIG. 8 shows a deposition step and a first etching step in the second embodiment.
Figure 8:
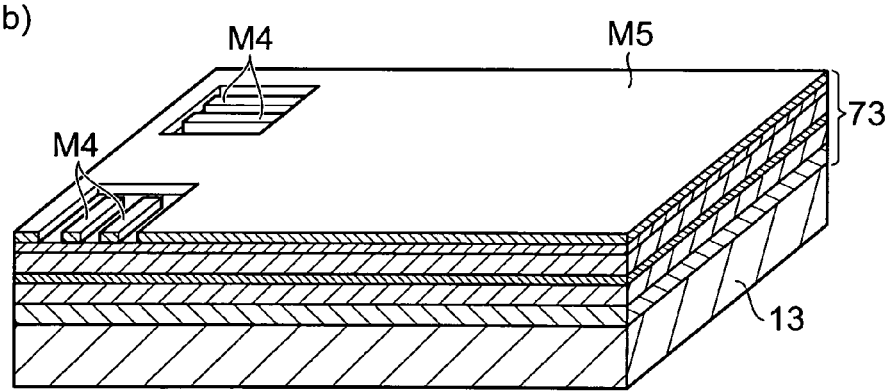

With reference to Part (a) of FIG. 8, an n-type InP substrate (InP wafer) 13 is prepared, and has the primary surface of (100) face. Next, a semiconductor layer 73 for a semiconductor mesa 15 shown in FIG. 7 is formed on the n-type InP substrate 13. Specifically, an n-type InP semiconductor film 61 for a buffer layer 17, a GaInAsP semiconductor film (or AlGaInAs semiconductor film) 63 for optical confinement layers 23 and 57, a GaInAsP/GaInAsP superlattice multilayer film (or AlGaInAs/AlGaInAs superlattice multilayer film) 65 for active layers 19 and 55, a GaInAsP semiconductor film (or AlGaInAs semiconductor film) 67 for optical confinement layers 25 and 59, and a p-type InP semiconductor film 69 for a capping layer are grown in series on the primary surface 13a of the InP substrate 13, as shown in Part (a) of FIG. 8. In a preferred embodiment, these semiconductor films 61, 63, 65, 67 and 69 may be epitaxially grown through metal-organic chemical vapor deposition (MOCVD). The n-type InP semiconductor film 61 may be doped with, for example, silicon (Si) as an n-type dopant.

(First Etching Step)

With reference to Part (b) of FIG. 8, etching masks M4 and M5 are formed on the semiconductor layer 73. The etching mask M4 has the first pattern that defines the planar shape of the alignment marks 51, and extends in the direction of an optical waveguide shown in FIG. 7. The semiconductor layer 73 has a mark region and a device region. The etching mask M5 provides a protecting cover to covers the entire surface of the device region of the semiconductor layer 73, and the etching mask M4 is located in the mark region. The etching mask M4 is apart from the etching mask M5, and a part of the mark region is exposed without covering any masks. Specifically, an insulating film (for example, SiN, SiON, or $SiO_2$) is first deposited on the semiconductor layer 73, and the insulating film has a thickness of, for example, 100 nm. Next, photoresist is applied onto the insulating film, and then is exposed to light to pattern the photoresist. The photoresist is developed to form a patterned photoresist, and the patterned photoresist includes the patterns that defines the planar shapes of the alignment marks 51 and the protecting cover. After developing the photoresist, the insulating film is etched through the patterned photoresist by dry etching, such as reactive ion etching (RIE), or by wet etching using etchant, such as hydrofluoric acid (HFaq) or buffered hydrofluoric acid (BHF). After the above steps, the etching masks M4 and M5 are formed and have first and second patterns for the planar shapes of the alignment marks 50 and the protecting cover, respectively. After forming the etching masks M4 and M5, the patterned photoresist is removed by ashing or liquid solution treatment.

Next, the semiconductor layer 73 is etched using the etching masks M4 and M5 to remove a part of the semiconductor layer 73 that is not covered with the etching masks M4 and M5. A preferred technique for this etching is, for example, dry etching such as RIE or wet etching using a mixed solution of Br and methanol or a solution containing hydrochloric acid. After the etching step, the n-type InP substrate 12 is exposed and the alignment marks 51 are formed. The alignment marks 51 include the active layer 55 and the optical confinement layers 57 and 59, as shown in Part (a) of FIG. 9, and the p-type InP semiconductor film 69 is left on the alignment marks 51. Thereafter, the etching masks M4 and M5 are removed. Since the etching masks M4 and M5 are composed of insulating films, these masks can be removed by, for example, wet etching using hydrofluoric acid (HFaq) or buffered hydrofluoric acid (BHF).

(Diffractive Grating Forming Step)

Figure 9:
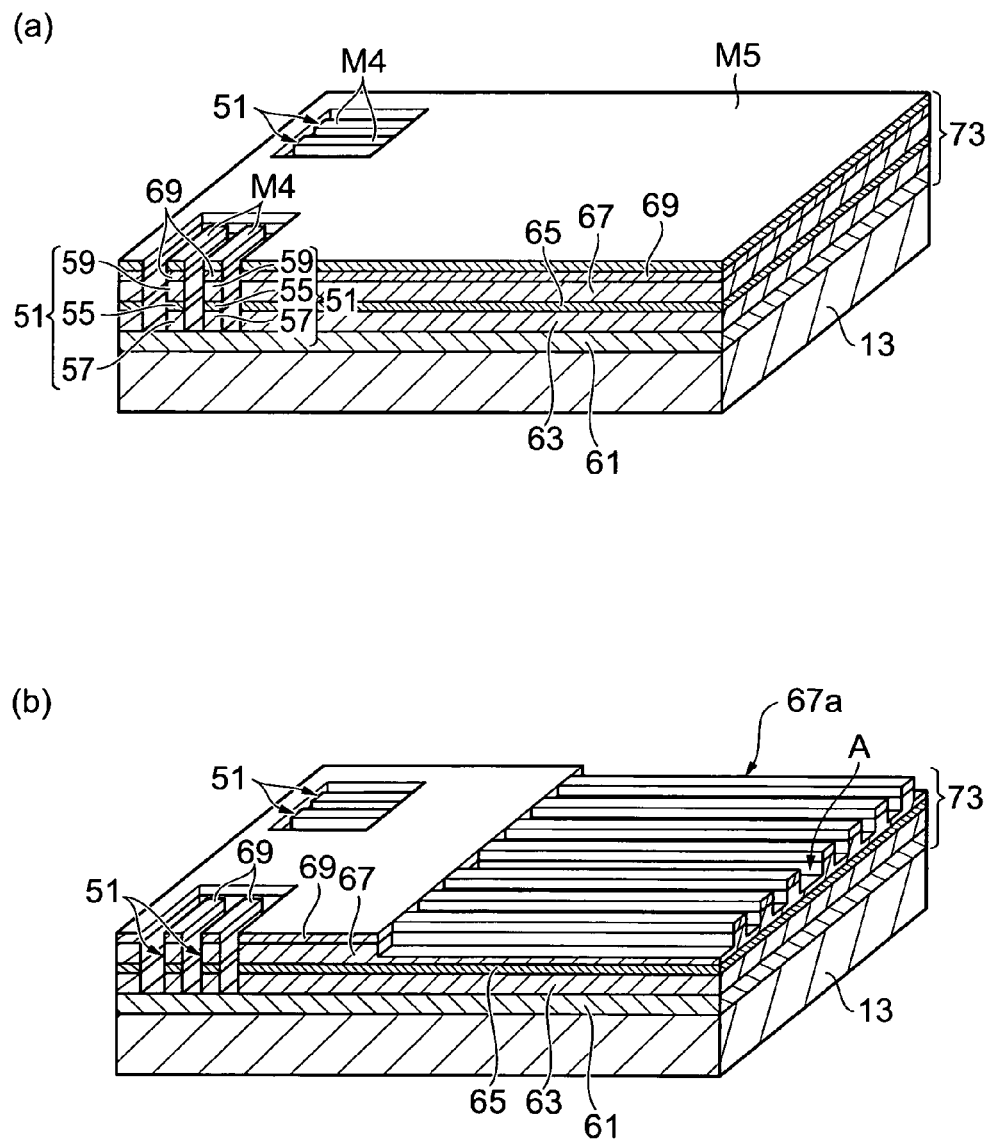
FIG. 9 shows the first etching step and a diffractive grating forming step in the second embodiment.

With reference to Part (b) of FIG. 9, a diffraction grating 67a is formed in a region of the GaInAsP semiconductor film 67 for forming the semiconductor laser 10b in the semiconductor laminate 73. This process for forming the diffraction grating 67a is similar to the above-described first etching step except for the shape of the etching masks and the depth of etching. In this step, the etching masks may be formed by, for example, photolithography, nanoinprint, or electron beam exposure. After forming the diffraction grating 67a, the p-type InP semiconductor film 69 as a capping layer is removed by etching.

One technique of DFB semiconductor lasers provides a structure having a phase-shifting diffraction grating provided with a phase-shifting region in the diffraction grating 67a, as shown in region A in Part (b) of FIG. 9. For example, a DFB semiconductor laser includes a diffraction grating having a λ/4 phase-shifting structure. When a diffraction grating having such a phase-shifting region is formed, the pattern of the etching mask to form the relevant diffraction grating can be aligned by use of the alignment marks 51.

In the DFB semiconductor laser with the phase-shifting diffraction grating, laser oscillation characteristics, such as a light intensity distribution in the semiconductor laser, a single-mode oscillation characteristic, and a light output, depend on the position of a phase-shifting region in the diffraction grating. Therefore, it is important to determine the position of the phase-shifting region with accurate reproducibility. Thus, the etching mask pattern for the diffraction grating can be aligned with the alignment marks 51 as described above, and by use of an etching mask, the phase-shifting region A of the diffraction grating 67a can be positioned in the semiconductor laser 10b with desired accurate reproducibility. Thereby, a sophisticated DFB semiconductor laser having excellent characteristics can be fabricated with a high yield rate.

(Cladding Layer Forming Step)

Figure 10:
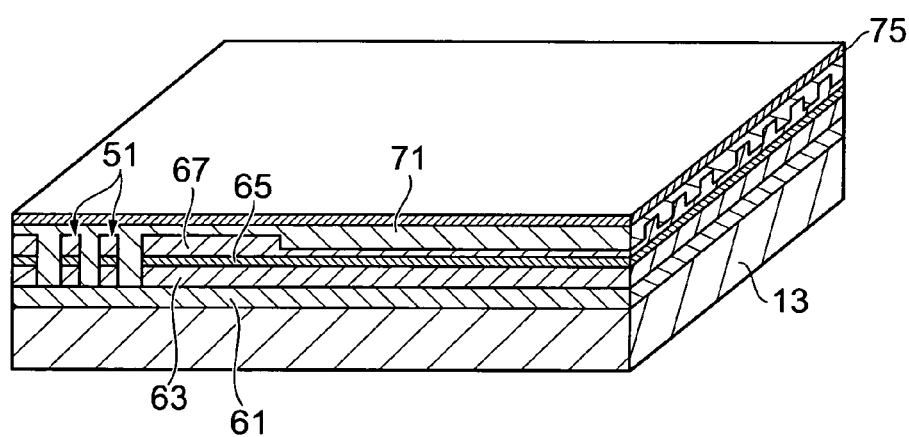
FIG. 10 shows a cladding layer forming step and a second etching step in the second embodiment.
Figure 10:
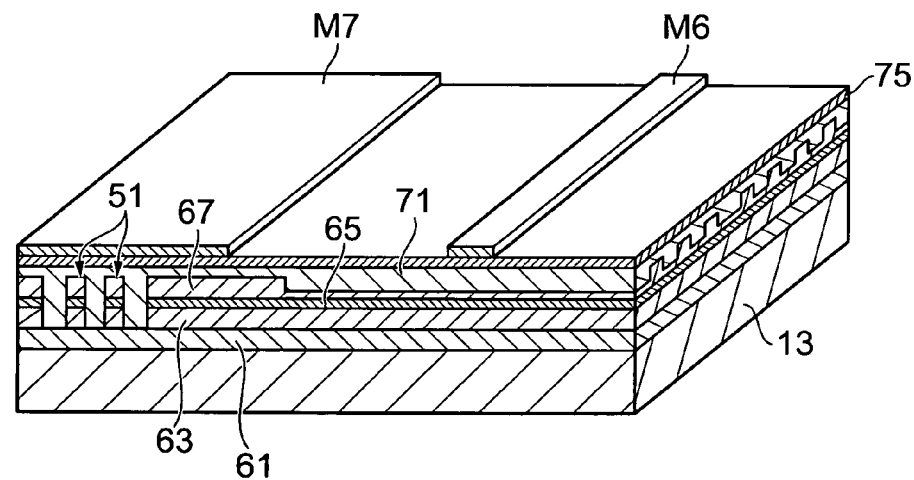

With reference to Part (a) of FIG. 10, a p-type InP semiconductor film 71 for forming the InP cladding layer 21 is grown above the entire surface of the InP substrate 13 to form the p-type InP semiconductor film 71 on the GaInAsP semiconductor film 67 and to embed the alignment marks 51. More preferably, a p-type GaInAs semiconductor film 75 for forming a capping layer is formed on the p-type InP semiconductor film 71. In one embodiment, p-type InP and p-type GaInAs can be epitaxially grown in series through MOCVD to form the p-type InP semiconductor film 71 and the p-type GaInAs semiconductor film 75.

(Second Etching Step)

With reference to Part (b) of FIG. 10, etching masks M6 and M7 are formed on the p-type InP semiconductor film 71, and in this embodiment, these etching masks are located on the p-type GaInAs semiconductor film 75. The semiconductor film 71 has a mark protecting region and a device mesa region. The etching mask M6 has a pattern to define the planar shape of the semiconductor mesa 15. The etching mask M6 is located on the device mesa region and extends in the same direction as the optical waveguide of the DFB laser. The etching mask M7 covers the mark protecting region, which includes the alignment marks 51 and a part of the p-type InP semiconductor film 71 that buries the alignment marks 51. This process for forming the etching masks M6 and M7 is similar to that for forming the etching masks M4 and M5 in the above-described first etching step except for their shapes.

Figure 11:
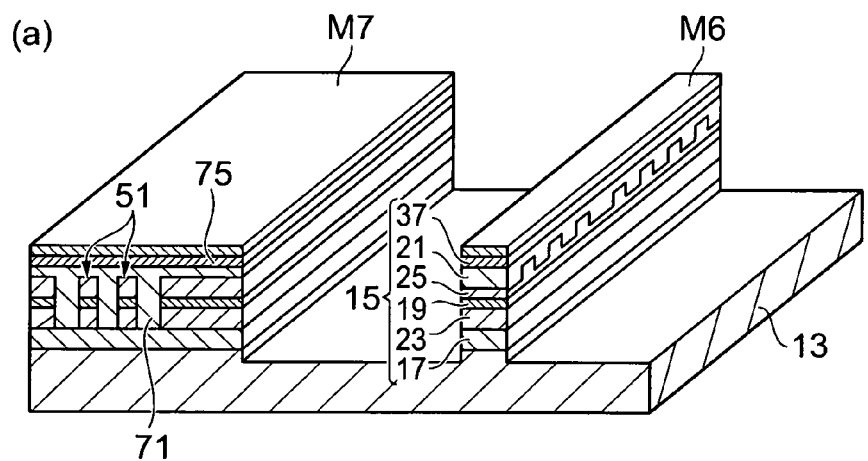
FIG. 11 shows the second etching step and a burying layer regrowth step in the second embodiment.
Figure 11:
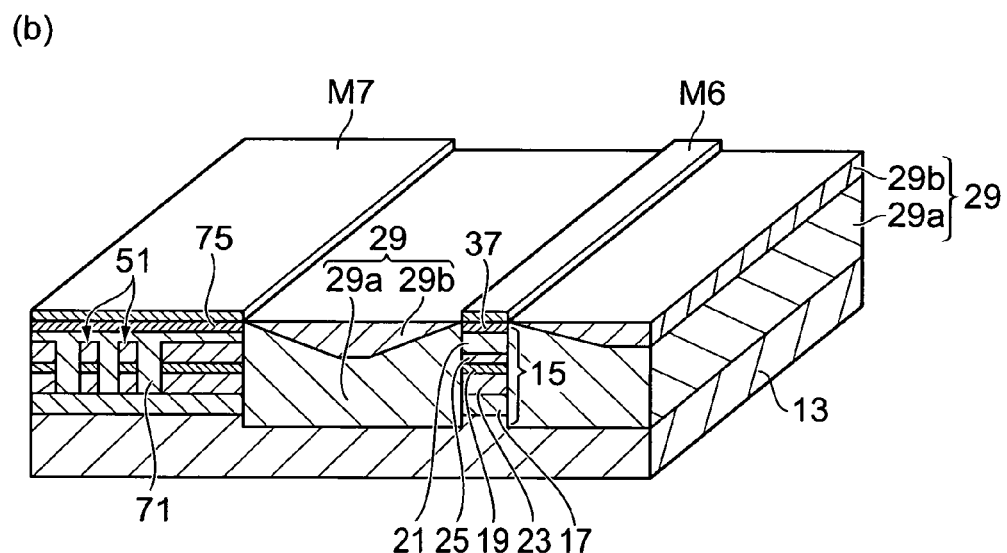

As shown in Part (a) of FIG. 11, the semiconductor films 61, 63, 65, 67, 71, and 75 are etched using the etching masks M6 and M7. Since the etching masks M6 and M7 do not cover a part of the semiconductor film 75, the part of the semiconductor film 75 together with the semiconductor films 61, 63, 65, 67 and 71 just below the semiconductor film 75 has been removed after the etching. A preferred technique for this etching is, for example, dry etching such as RIE or wet etching using a mixed solution of Br and methanol. After the etching, the n-type InP substrate 13 is exposed, and the depth is, for example, about 2.0 μm. Thereby, the semiconductor mesa 15 is formed which includes the buffer layer 17, the optical confinement layer 23, the active layers 19, the optical confinement layer 25, the InP cladding layer 21, and a capping layer 37.

(Burying Step)

With reference to Part (b) of FIG. 11, an InP burying region 29 is grown on the InP substrate 13 such that the etching masks M6 and M7 are exposed, thereby burying both side surfaces of the semiconductor mesa 15. In a preferred embodiment, a p-type InP layer 29a and an n-type InP layer 29b may be epitaxially grown in series by MOCVD to form the InP burying region 29. Alternatively, Fe-doped InP may be epitaxially grown by MOCVD to form the InP burying region 29.

Then, the etching masks M6 and M7 are removed. Since the etching masks M6 and M7 are composed of insulating films, these masks can be removed by, for example, wet etching using hydrofluoric acid (HFaq) or buffered hydrofluoric acid (BHF). Then, the capping layer 37 and the p-type GaInAs semiconductor film 75, which is a part of a capping layer covered with the etching mask M7, are removed by, for example, phosphoric acid ($H_3PO_4$). This can moderate the effect on crystal growth in a step of forming a cladding contact described below.

(Cladding-Contact Forming Step)

Figure 12:
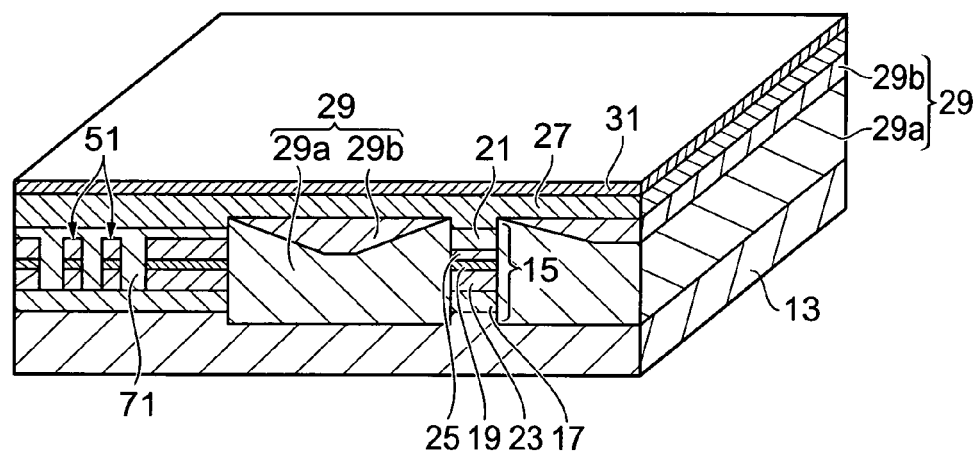
FIG. 12 shows a cladding-contact forming step and a third etching step in the second embodiment.
Figure 12:
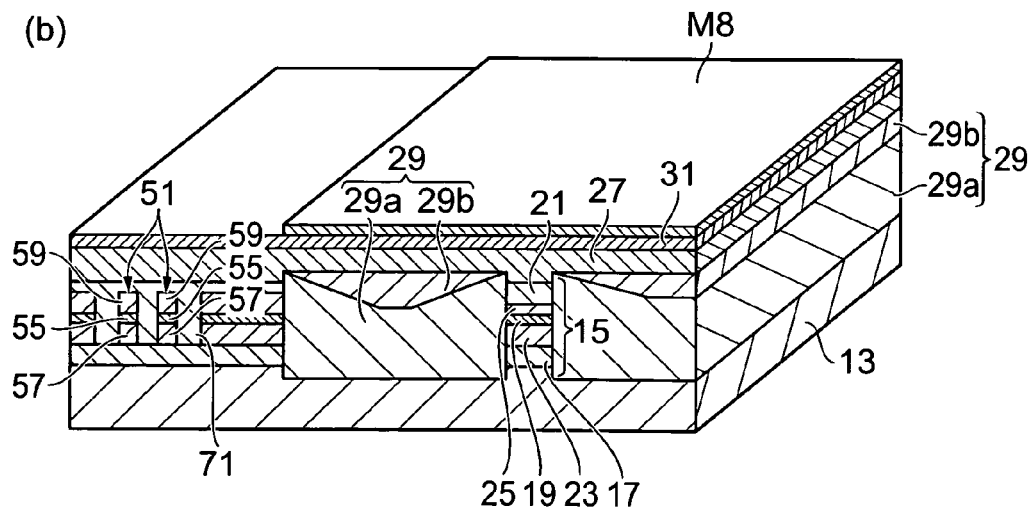

With reference to Part (a) of FIG. 12, a p-type InP semiconductor film is grown over the entire surface of the n-type InP substrate 13 to form an InP cladding layer 27. Accordingly, the InP cladding layer 27 is provided over the semiconductor mesa 15, the burying region 29, and the p-type InP semiconductor film 71 that buries the alignment marks 51. Then, a p-type GaInAs semiconductor film is grown on the InP cladding layer 27 to form the contact layer 31. In a preferred embodiment, the p-type InP semiconductor film for forming the InP cladding layer 27, and the p-type GaInAs semiconductor film for forming the contact layer 31 may be epitaxially grown by MOCVD.

(Third Etching Step)

With reference to Part (b) of FIG. 12, an etching mask M8 is formed, and the etching mask M8 covers the semiconductor mesa 15 and a part of the InP burying region 29. The part of the InP burying region 29 is located beside the semiconductor mesa 15 and cover both side surfaces of the semiconductor mesa 15. Specifically, an insulating film (for example, SiN, SiON, or $SiO_2$) is first deposited on the contact layer 31, and the thickness of the insulating film is, for example, 100 nm. Next, photoresist is applied onto the insulating film, and then is exposed to light to transfer a pattern that defines the semiconductor mesa 15 and the part of the InP burying region 29. Since an alignment in this step does not need a high accuracy, the center and the orientation flat OF of the wafer may be mechanically detected to carry out this alignment of the exposed region as shown in FIG. 2.

After developing the exposed photoresist to form the patterned photoresist, the insulating film is etched through the patterned photoresist by dry etching, such as reactive ion etching (RIE), or by wet etching using hydrofluoric acid (HFaq) or buffered hydrofluoric acid (BHF). This etching forms the etching mask M8. The patterned photoresist is removed by ashing or liquid solution treatment.

Next, each of the semiconductor layers deposited on the InP substrate 13 is etched using the etching mask M8 to remove a semiconductor region which is not covered with the etching mask M8. This etching is carried out by an etchant having a smaller etching rate for the active layer 55 included in the alignment marks 51 than for InP to selectively etch the contact layer 31 and the InP cladding layer 27 that cover the alignment marks 51, and the p-type InP semiconductor film 71 that buries the alignment marks 51, thereby exposing the alignment marks 51. In a preferred embodiment, in the alignment marks 51 including the active layer 55 and the optical confinement layers 57 and 59 which are composed of, for example, GaInAsP or AlGaInAs, a solution containing hydrochloric acid may used as the etchant.

Figure 13:
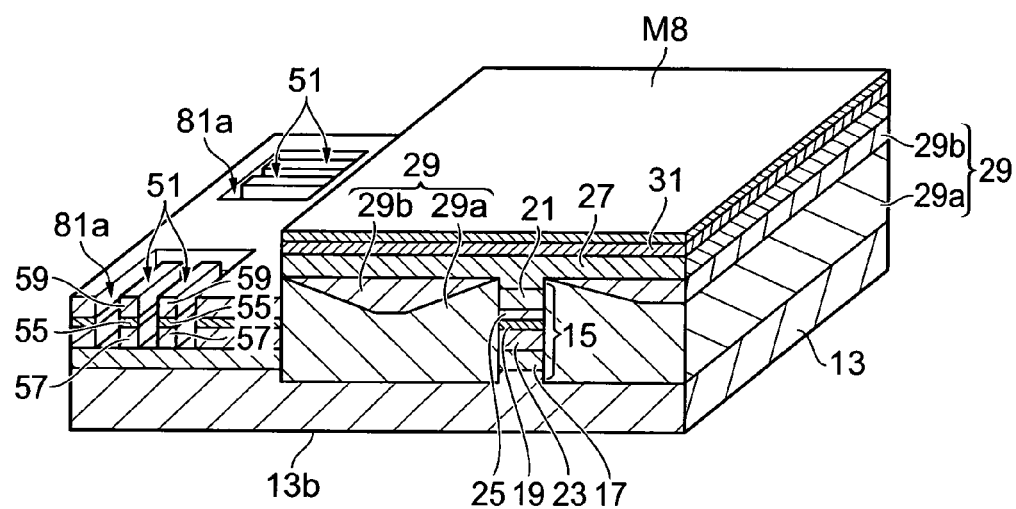
FIG. 13 shows the third etching step in the second embodiment.

As a result, as shown in FIG. 13, each of the alignment marks 51 having the optical confinement layer 57, the active layer 55, and the optical confinement layers 59 form a protrusion on the mark region 81a located on the InP substrate 13. Then, the etching mask M8 is removed by, for example, wet etching using hydrofluoric acid (HFaq) or buffered hydrofluoric acid (BHF). The above-described steps provide the semiconductor laser 10b and the alignment marks 51 as shown in FIG. 7.

(Insulating Layer and Electrode Forming Step)

Then, an insulating layer is formed on the contact layer 31, and has an opening on the semiconductor mesa. An electrode is formed on the insulating layer and the contact layer 31, and is connected to the contact layer 31 through the insulating layer. Another electrode is formed on a backside 13b of the InP substrate 13. In these steps, the alignment marks 51 that has been formed in the previous step are used as a fiducial for alignment. Finally, the InP substrate 13 is divided into semiconductor laser chips to obtain BH structure DFB semiconductor lasers 10b.

The method of fabricating an optical semiconductor device in accordance with this embodiment provides advantages as follows. In the method in accordance with this embodiment, the GaInAsP semiconductor film (or AlGaInAs semiconductor film) 63 for the optical confinement layer 23, the GaInAsP/GaInAsP superlattice multilayer film (or AlGaInAs/AlGaInAs superlattice multilayer film) 65 for the active layer 19, and the GaInAsP semiconductor film (or AlGaInAs semiconductor film) 67 for the optical confinement layer 25 are etched to form the alignment marks 51 (First Etching Step), and then the alignment marks are buried by the p-type InP semiconductor film 71 for an InP cladding layer. Then, in the third etching step after the second etching step and the burying step, a difference in the etching rates between the p-type InP semiconductor film 71 and the alignment marks 51 is utilized to selectively etch the p-type InP semiconductor film 71 that covers the alignment marks 51, thereby properly exposing the alignment marks 51. In this way, in the method in accordance with the present embodiment, since a process for forming the semiconductor laser 10b can be utilized to protect the alignment marks 51, a additional film to protect the alignment mark 51 is not needed. Therefore, the alignment marks 51 can be surely protected without an additional step to protect the alignment mark 51 compared to conventional processes.

In addition, it is more preferred that the alignment marks 51 are composed of GaInAsP or AlGaInAs, and a solution containing hydrochloric acid is used as the etchant in the third etching step in this embodiment. This enables the third etching step to selectively etch InP (the p-type InP semiconductor film 71) that covers the alignment marks 51.

The method of fabricating an optical semiconductor device in accordance with this embodiment is not limited to the above-described embodiments, but can be modified in other various ways. For example, a semiconductor laser element is exemplified as an optical semiconductor device in these embodiments, but the present invention can also be applied to other optical semiconductor devices such as an optical modulation semiconductor element, a semiconductor optical integrated element integrating a semiconductor laser element and an optical modulation semiconductor element, or an optical multiplexer/demultiplexer.

The present invention is applied to an optical semiconductor device formed by depositing an n-type buffer layer, an active layer, and a p-type InP cladding layer on an n-type InP substrate in the above embodiments, but can also be applied to an optical semiconductor device formed by depositing a p-type buffer layer, an active layer, and an n-type InP cladding layer on a p-type InP substrate. In addition, GaInAsP and AlGaInAs are exemplified as materials for an active layer in these embodiments, but an active layer enabling the selective etching of InP may have another composition in the present invention.

Having described and illustrated the principle of the invention in a preferred embodiment thereof, it is appreciated by those having skill in the art that the invention can be modified in arrangement and detail without departing from such principles. Details of structures of these devices can be modified as necessary. We therefore claim all modifications and variations coming within the spirit and scope of the following claims.

What is claimed is:

1. A method of fabricating an optical semiconductor device, comprising:
    forming a semiconductor layer on an InP region, the semiconductor layer including a plurality of semiconductor films;

forming a first etching mask on the semiconductor layer, the first etching mask having a pattern;

etching the semiconductor layer through the first etching mask to form a semiconductor mesa and a first marking mesa, each of the semiconductor mesa and the first marking mesa including an active layer and an InP cladding layer, the InP cladding layer being provided on the active layer, the active layer being made of semiconductor material, and the semiconductor material being different from InP;

growing an InP burying region through the first etching mask on a side of the semiconductor mesa and a side of the first marking mesa to bury the semiconductor mesa and the first marking mesa;

forming a second etching mask on the InP burying region after removing the first etching mask, the second etching mask having an opening, the opening being located above the first marking mesa; and etching InP in the InP burying region and the first marking mesa through the second etching mask to form a second marking mesa, the alignment mark including the second marking mesa, the active layer being exposed on the top of the second marking mesa.

2. The method of fabricating an optical semiconductor device according to claim 1, wherein InP in the InP burying region and the first marking mesa is etched by use of an etchant, and the etchant has a smaller etching rate for the active layer than for InP.

3. The method of fabricating an optical semiconductor device according to claim 1, wherein the active layer comprises one of GaInAsP and AlGaInAs.

4. The method of fabricating an optical semiconductor device according to claim 1, wherein InP in the InP burying region and the first marking mesa is etched by use of an etchant, and the etchant includes hydrochloric acid.

5. The method of fabricating an optical semiconductor device according to claim 1, wherein the InP burying region has a part formed on the side of the first marking mesa, the part of the InP burying region is adjacent to the side of the first marking mesa, and the opening of the second etching mask is located on the part of the InP burying region.

6. The method of fabricating an optical semiconductor device according to claim 1, wherein the InP burying region has a part formed on the side of the semiconductor mesa, the part of the InP burying region is adjacent to the side of the semiconductor mesa, and the second etching mask is located on the semiconductor mesa and the part of the InP burying region.

7. The method of fabricating an optical semiconductor device according to claim 1, wherein the active layer comprises an optical confinement layer.

8. The method of fabricating an optical semiconductor device according to claim 7, wherein the optical confinement layer comprises one of GaInAsP and AlGaInAs.

9. The method of fabricating an optical semiconductor device according to claim 1, wherein the active layer comprises a quantum well structure.

10. The method of fabricating an optical semiconductor device according to claim 1, wherein the InP region comprises an InP substrate.

11. A method of fabricating an optical semiconductor device, comprising:

growing an active layer on an InP region, the active layer being made of semiconductor material, and the semiconductor material being different from InP;

forming a first etching mask on the active layer, the first etching mask having a pattern;

etching the active layer through the first etching mask to form an alignment mark;

growing an InP cladding layer on the active layer and a side and a top of the alignment mark, the alignment mark being buried by the InP cladding layer;

forming a second etching mask on the InP cladding layer, the second etching mask having a first pattern for a semiconductor mesa, and the second etching mask having a second pattern above the alignment mark and a first part of the InP cladding layer, the first part of the InP cladding layer covering the side and top of the alignment mark;

etching the active layer and the InP cladding layer through the second etching mask to form the semiconductor mesa;

growing InP on a side of the semiconductor mesa to bury the semiconductor mesa;

forming a third etching mask on the semiconductor mesa and the InP cladding layer, the third etching mask having an opening, the opening being located on the alignment mark;

etching InP in the InP cladding layer through the third etching mask to expose the alignment mark, the active layer being exposed on the top of the alignment mark.

12. The method of fabricating an optical semiconductor device according to claim 11, wherein InP in the InP cladding layer is etched by use of an etchant, and the etchant has a smaller etching rate for the active layer than for InP.

13. The method of fabricating an optical semiconductor device according to claim 11, wherein the active layer comprises one of GaInAsP and AlGaInAs.

14. The method of fabricating an optical semiconductor device according to claim 11, wherein InP in the InP burying region and the first marking mesa is etched by use of an etchant, and the etchant includes hydrochloric acid.

15. The method of fabricating an optical semiconductor device according to claim 11, further comprising after forming the first mask, before growing the InP cladding layer, forming a diffraction grating on the active layer.

16. The method of fabricating an optical semiconductor device according to claim 11, wherein the InP cladding layer has a second part formed on the side of the semiconductor mesa, the second part of the InP cladding layer is adjacent to the side of the semiconductor mesa, and the third etching mask is located on the semiconductor mesa and the second part of the InP cladding layer.

17. The method of fabricating an optical semiconductor device according to claim 11, wherein the active layer comprises an optical confinement layer.

18. The method of fabricating an optical semiconductor device according to claim 17, wherein the optical confinement layer comprises one of GaInAsP and AlGaInAs.

19. The method of fabricating an optical semiconductor device according to claim 11, wherein the active layer comprises a quantum well structure.

20. The method of fabricating an optical semiconductor device according to claim 11, wherein the InP region comprises an InP substrate.

* * * * *